United States Patent [19]
Kitabatake et al.

[11] Patent Number: 5,958,141
[45] Date of Patent: Sep. 28, 1999

[54] DRY ETCHING DEVICE

[75] Inventors: Akihiro Kitabatake; Keiji Yamada, both of Osaka, Japan

[73] Assignee: Sanyo Vacuum Industries Co., Ltd., Higashiosaka, Japan

[21] Appl. No.: 08/927,213

[22] Filed: Sep. 11, 1997

[51] Int. Cl.$^6$ ................................................ C23C 16/00
[52] U.S. Cl. ................... 118/730; 118/729; 118/723 MA; 118/723 MR; 156/345
[58] Field of Search .................................... 118/729, 730, 118/723 MR, 723 MA; 156/345

[56] References Cited

U.S. PATENT DOCUMENTS 5,374,313  12/1994  Doehler .................................. 118/719
5,378,284   1/1995  Geisler et al. ................... 118/723 MR

*Primary Examiner*—R. Bruce Breneman
*Assistant Examiner*—Erin Fieler
*Attorney, Agent, or Firm*—Armstrong, Westerman, Hattori, McLeland & Naughton

[57] ABSTRACT

The dry etching device according to the present invention comprises a vacuum chamber connected to a vacuum source, a gas supply unit including a gas supply source and a number of gas supply pipes for leading a gas from the gas supply source to an inside of the vacuum chamber, and a number of electrical discharge electrodes, respectively arranged inside the vacuum chamber, for changing the gas led to the inside of the vacuum chamber into a plasma, active ions or both of the plasma and the active ions, wherein the electrical discharge electrode has a number of circular or polygonal ring shaped permanent magnets detachably interfitted into a shaft at regular intervals via each insulator in a magnetizing direction of the each permanent magnet, and aligned so that each magnet pole of the permanent magnets adjacent to each other may be equal to that of the adjacent permanent magnet.

20 Claims, 5 Drawing Sheets

DRY ETCHING DEVICE

BACKGROUND OF THE INVENTION

1. Field of the Invention

The present invention relates to a dry etching device for etching by a gas plasma generated inside a vacuum chamber.

2. Description of the Prior Art

As an etching method for etching a surface of a semiconductor substrate, a glass substrate for a liquid crystal display or the like according to predetermined patterns, a wet etching method for etching it by using a liquid (an alkali or acid solvent) is conventionally known. However, recently, a dry etching method by using a gas plasma, wherein a liquid washing step and a drying step performed thereafter can be omitted, and refined patterns can be accurately finished, has widely been utilized. As the dry etching method, it is generally known a chemical dry etching (referred to as CDE) operated a chemical etching mechanism, a reactive ion etching (referred to as RIE) operated a chemical and physical etching mechanism, or a spattering etching operated physical etching mechanism.

In any of the above dry etching methods, in the present state, processing ability of an employed dry etching device has a limit, thereby leaving a problem in view of improvement of productivity. Especially, a demand for enlarging a liquid crystal substrate has recently been increased, but, in the conventional dry etching device, as an object to be etched is larger, the processing ability thereof is decreased. Then, there is a method for enlarging a dry etching device itself so as to proceed the large substrate. However, in this case, a plasma density inside the device is decreased thereby being impossible to etching efficiently. In other words, in any case, it has been difficult to work a large liquid crystal substrate or the like at a time and in large quantities.

SUMMARY OF THE INVENTION

To resolve the above problems, an object of the present invention is to provide a dry etching device making it possible to efficiently work a large substrate or the like at a time, in large quantities and at high speed, and enhance an etching accuracy.

In order to achieve the above object, the dry etching device according to the present invention comprises vacuum chamber connected to a vacuum source, a gas supply unit including a gas supply source and a number of gas supply pipes for leading a gas from the gas supply source to an inside of the vacuum chamber, and a number of electrical discharge electrodes, respectively arranged inside the vacuum chamber, for changing the gas led to the inside of the vacuum chamber into a plasma, active ions, or both of the plasma and the active ions, wherein the electrical discharge electrode has a number of circular or polygonal ring shaped permanent magnets detachably interfitted into a shaft at regular intervals via each insulator in a magnetizing direction of the each permanent magnet, and aligned so that each magnet pole of the permanent magnets adjacent to each other may be equal to that of the adjacent permanent magnet.

In the dry etching device, the electrical discharge electrode may be structurally provided with driving means for reciprocating the permanent magnets in an aligning direction thereof with predetermined strokes.

The gas supply unit may be structurally provided with microwave introducing means for introducing a microwave for previously changing the gas fed inside the vacuum chamber into the plasma, the active ions or the both of the plasma and the active ions.

Moreover, the gas supply unit may be structurally provided with microwave introducing means for introducing a microwave for previously changing the gas fed inside the vacuum chamber into the plasma, the active ions or the both of the plasma and the active ions.

Furthermore, an anode electrode may be structurally disposed in the neighborhood of the each electrical discharge electrode.

In case that the electric power fed to the electrical discharge electrode is a high frequency electric power, it is preferable that the dry etching device is provided with each matching box incorporating a phase shifter for controlling a phase of a high frequency electric power fed to the each electrical discharging electrode, and a bias controller for controlling a direct current self-bias of the each electrical discharge electrode, thereby feeding the electric power from the high frequency electric power to the each electric discharge electrode via the each matching box.

The above structure may be applied to a so-called Carnot cell-type dry etching device wherein a rotating table and a number of substrate holders, concentrically disposed on a circumference of the rotating table, for supporting a number of substrates etched on the respective upper surfaces and lower surfaces thereof may be structurally disposed inside the vacuum chamber, and the electrical discharge electrodes and the gas supply pipes are concentrically positioned opposite to each other along a moving locus of the each substrate on the respective upper surface and lower surface of the each substrate holders.

The above structure may be applied to a so-called in-line-type dry etching device wherein a carrier conveyor for linearly moving and a number of substrate holders, disposed on the carrier conveyor, for supporting a number of substrates etched on the respective upper surfaces and lower surfaces thereof are disposed inside the vacuum chamber, and the electrical discharge electrodes and the gas supply pipes are linearly positioned opposite to each other along a moving locus of the each substrate on the respective upper surface and lower surface of the each substrate holder.

In the dry etching device according to the present invention, the electrical discharge electrodes are arranged at regular intervals via each insulator so that a number of circular or polygonal ring shaped permanent magnets may be attracted each other, thereby being able to generate the plasma having a high density in the neighborhood of the each electrode. Moreover, the permanent magnets can be detachably interfitted into a shaft, thereby enabling the electrical discharge electrode to be formed in a desirable size, and facilitating etching of the substrate having a large area.

By reciprocating the permanent magnets in an aligning direction thereof with predetermined strokes, the density of the plasma or the like generated in the neighborhood of the each electrical discharge electrode can be uniformed, thus etching the surface of the substrate uniformly and improving the etching accuracy.

In case of feeding the gas previously changed into the plasma, the active ions or the both of the plasma and the active ions by introducing the microwave from microwave introducing means, inside the vacuum chamber, the gas is changed into the plasma, the active ions or the both of the plasma and the active ions by discharge after feeding the gas, whereby a large quantity of plasma, a large numbers of radical ions or both of them are generated surrounding the electrical discharge electrodes. As a result, an etching speed is increased.

In case of feeding simultaneously a high frequency electric power to a number of electrical discharge electrodes disposed inside a vacuum chamber, it is unstable to generate the plasma, whereby there is a possibility of often causing many troubles such as a charge-up or an abnormal discharge. Then, an anode electrode is disposed near the each electrical discharge electrode, thereby making it possible to prevent the troubles. As another means, the dry etching device is provided with a matching box incorporating a phase shifter and a bias controller, and the electric power from the high frequency electric power is fed to the electric discharge electrode via the matching box, whereby a phase control of the high frequency electric power and a direct current self-bias of the electrical discharge electrode are controlled so as to make them most suitably conditioned. Consequently, a mutual interference is not caused between these electrical discharge electrodes, and generating the plasma or the like is stabilized. In addition, by applying the applied high frequency voltage pulse in series or a pulsing state, the prevention of the abnormal discharge and a control of etching shape can be performed.

DETAILED DESCRIPTION OF THE PREFERRED EMBODIMENTS

Referring to drawings, preferred embodiments are described as below.

Figure 2:
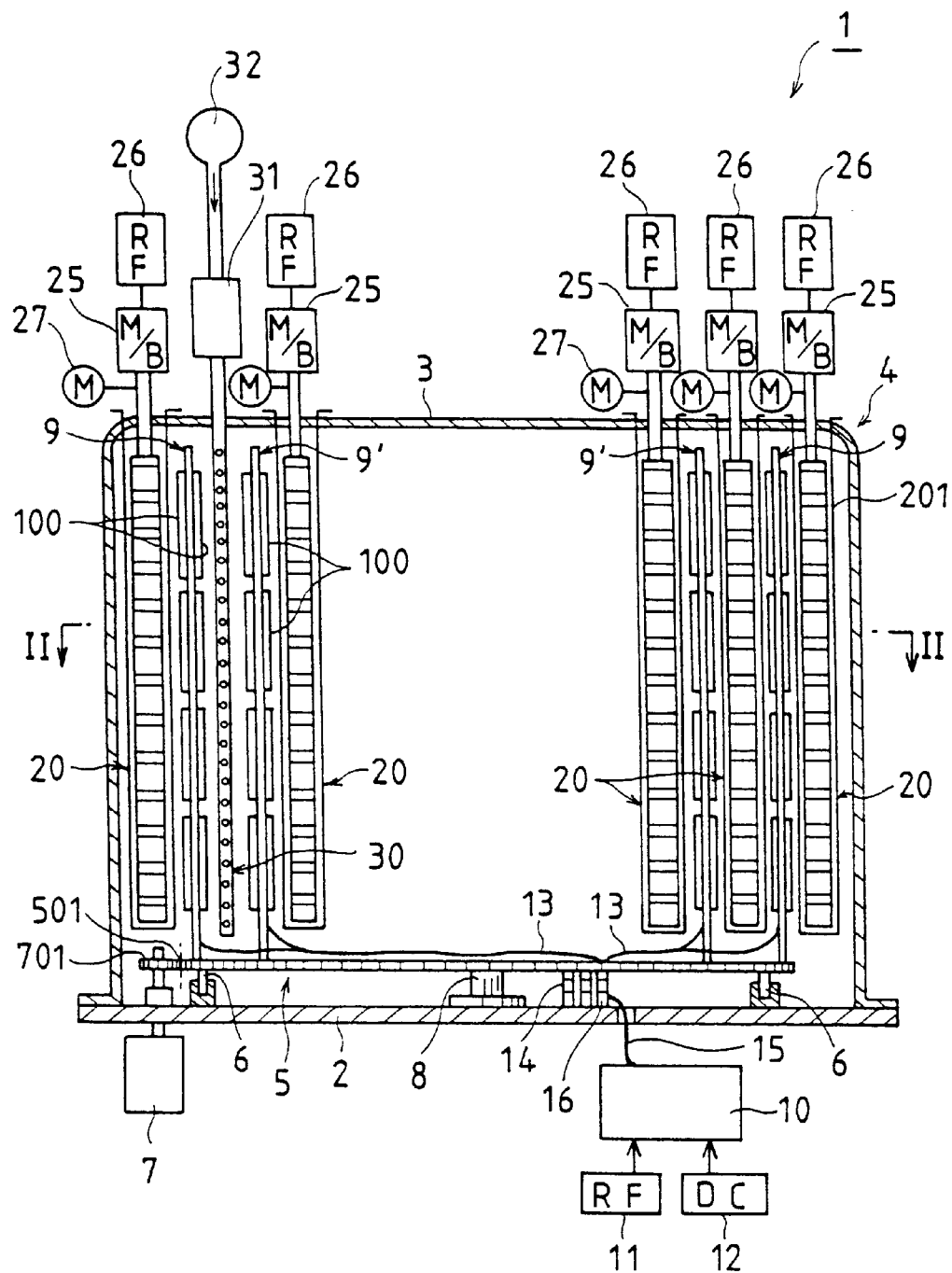
FIG. 2 is a longitudinal sectional view illustrating an embodiment of the dry etching device according to the present invention employing the electrical discharge electrode shown in FIG. 1.
Figure 3:
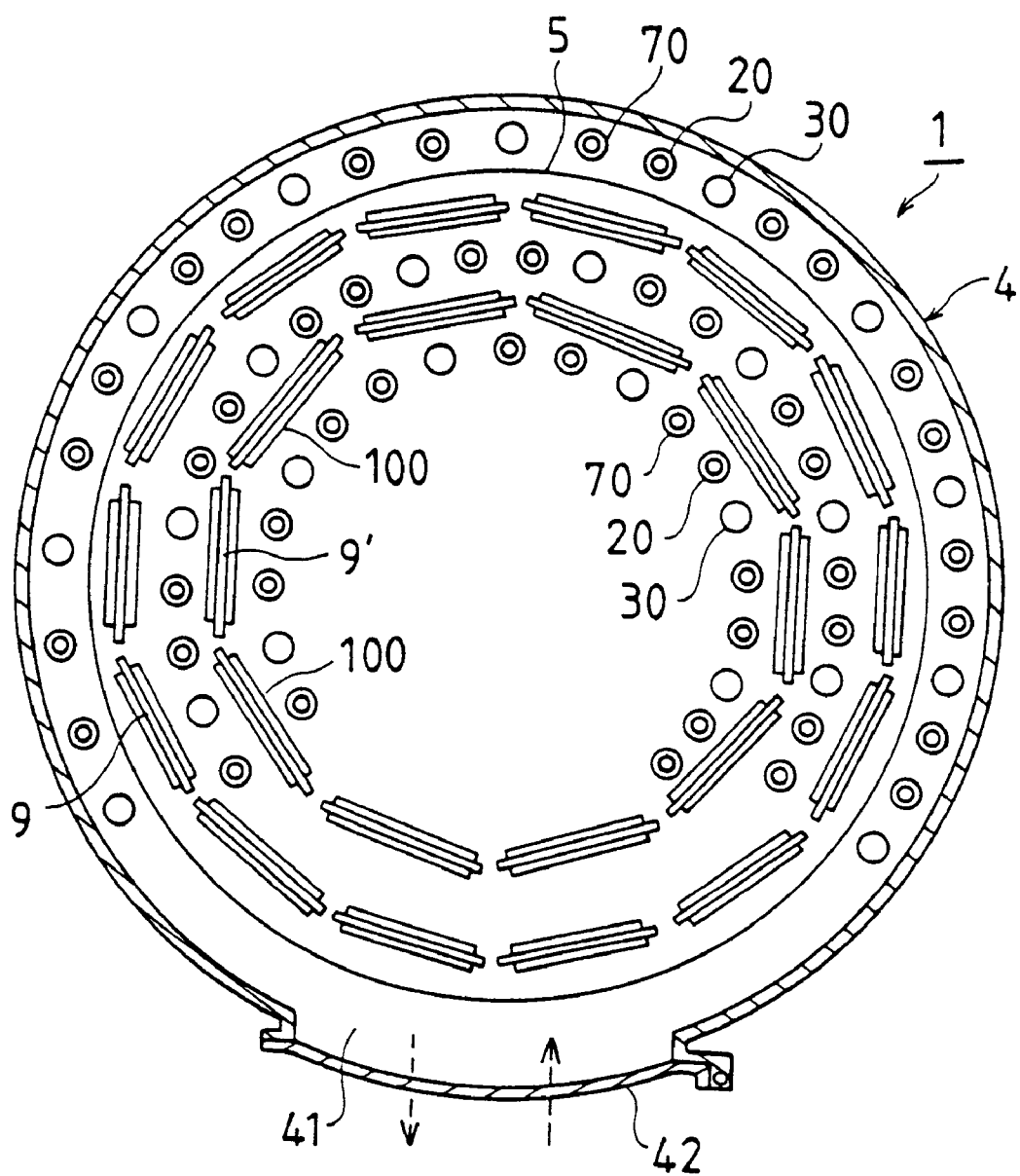
FIG. 3 is a sectional view taken along the line II—II in FIG. 2.

FIG. 2 is a longitudinal sectional view illustrating structurally an embodiment of the dry etching device according to the present invention and FIG. 3 is a sectional view taken along the line II—II in FIG. 2.

As shown in the Figures, the dry etching device 1 has a vacuum chamber 4 formed by disposing a cylindrical container on a plate 2. The vacuum chamber 4 is connected to a vacuum pump (or a vacuum source), not shown, disposed outside via an exhausting mouth (not shown) formed on the plate 2. As a result, the pump makes an inside of the vacuum chamber 4 predeterminately vacuum-conditioned.

Inside the vacuum chamber 4, a rotating table 5 having teeth 501 formed surrounding the rotating table 5 is disposed. The rotating table 5 is supported on the plate 2 by means of bearing the circumference lower surface thereof by rollers 6. The teeth 501 arranged on the rotating table 5 is engaged with a gear 701 disposed at a tip of an axle of a rotating table driving motor (rotating driving means) 7 arranged on the plate 2 to drive the motor 7, thereby rotating the rotating table 5 around a center axle 8 positioned on the plate 2, at desirable speed.

On the rotating table 5, at the circumference thereof and a point where a predetermined distance between the circumference thereof and a center of the rotating table 5 is kept, a number of substrate holders 9, 9' are concentrically positioned via insulators (not shown). On both sides of the substrate holders 9, 9', a number of glass substrates 100 as etching objects are detachably fixed. Moreover, the substrate holders 9, 9' are connected to an RF electric source 11 and a DC electric source 12 via the matching box 10 disposed outside the vacuum chamber 4.

At the lower surface of the rotating table 5, a table terminal 14 electrically connected to the each substrate holder 9, 9' via an electric wire 13 is disposed. On the upper surface of the plate 2, plate terminals 16 connected to a matching box 10 via an electric wire 15 are disposed. In rotating the rotating table 5, the table terminal 14 is contacted on the plate terminals 16 while rotating around the center axle 8, whereby a predetermined high frequency electric power or direct current electric power, or the superposed both of them are applied to the each substrate holder 9 from the RF electric source 11 and/or the DC electric source 12 via the matching box 10, thereby causing an electric field going to the each substrate holder 9 in a negative electric field or a surrounding space. The voltage applied to the each substrate holder 9 differs according to an introduced gas. In this embodiment, the voltage is concretely from −200 V to −100 V.

Furthermore, inside the vacuum chamber 4, along each rotating locus of the each substrate holder 9' positioned at a relative inner side (center side) of the vacuum chamber 4 and the each substrate holder 9 positioned at an outer side thereof, respective plasma generating electrodes 20 are concentrically positioned at the inner side and outer side thereof, and an anode electrode 70 is positioned near the each plasma generating electrode 20. Each gas supply pipe 30 for leading a gas fed from a gas supply source 32 to the inside of the vacuum chamber 4 is positioned opposite to the anode electrode 70 so as to interpose the plasma generating electrode 20. The gas supply pipe 30, the plasma generating electrode 20 and the anode electrode 70 are concentrically arranged in order at each equal interval. All of the gas supply pipe 30, the plasma generating electrode 20 and the anode electrode 70 are inserted from an outside of the vacuum chamber 4 to an inside thereof via a ceiling of a container 3, so as to be disposed opposite to the substrate 100 mounted on the both sides of the each substrate holder 9, 9'. Owing to necessitating an operation of taking the substrates 100 in and out, the portion corresponding to an entrance 41 disposed at a side wall of the vacuum chamber 4 is not provided with any of the gas supply pipe 30, the plasma generating electrode 20 and the anode electrode 70.

Figure 1:
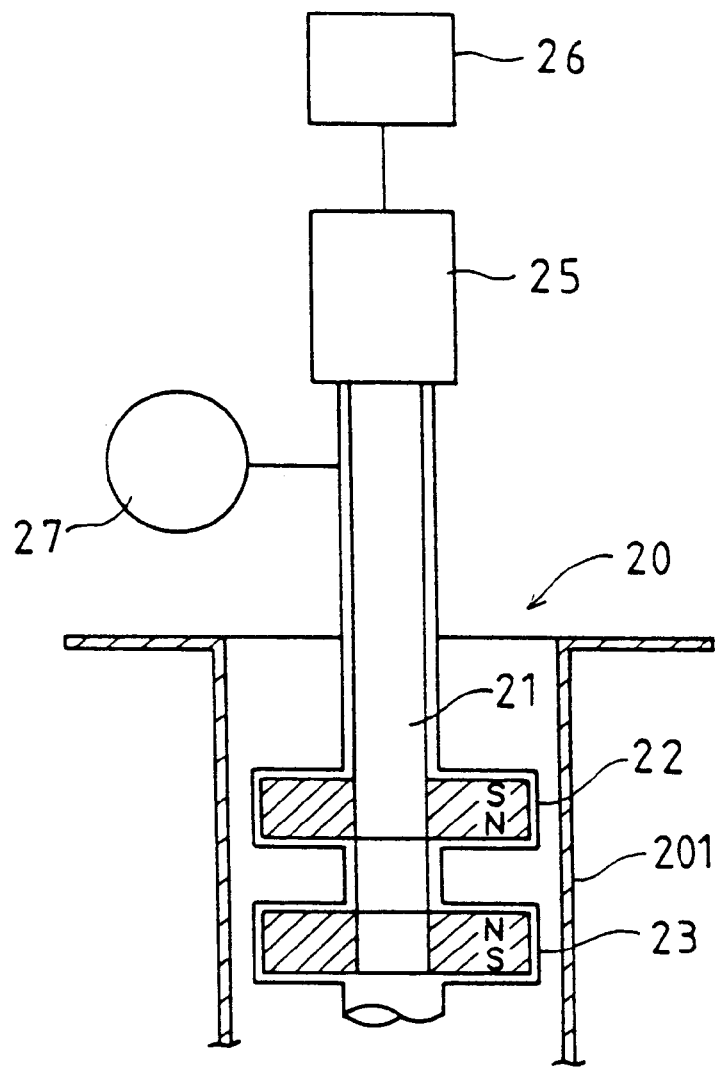
FIG. 1 is a longitudinal sectional view illustrating a structure of an electrical discharge electrode applied to a dry etching device according to the present invention.

An enlarged sectional view of the plasma generating electrode 20 is shown in FIG. 1.

The plasma generating electrode 20 has a structure wherein a number of circular or polygonal ring shaped permanent magnets 23 covered with each non-magnetic body 22 is interfitted into a periphery of a metal shaft 21, each polarity of the permanent magnets 23 adjacent to each other is equal to that of the adjacent permanent magnet 23 so that the permanent magnets 23 adjacent to each other may be repelled each other, and a spacer 24 composed of a metallic material or an insulator is disposed between the permanent magnets 23, and they are stored by a tube body 201. The plasma generating electrode 20 can be adjusted in length by increasing or decreasing the number of the permanent magnets 23 so as to correspond to the substrate having a desirable size. Thus, by constructing a magnetic field by the permanent magnets 23, the plasma of a high density can be generated in the neighborhood of the plasma generating electrode 20. In other words, a discharge is caused in a low impedance state, with the result that the electric power fed from each RF electric source 26 is efficiently exchanged into the discharge energy to generate a large quantities of plasma in the neighbor hood of the plasma generating electrode 20.

As shown in FIG. 2, the plasma generating electrodes 20 are respectively connected to the each RF electric source 26 via each matching box 25. The matching box 25 includes incorporatively a phase shifter for controlling a phase of the high frequency electric power fed to the plasma generating electrodes 20 and a bias controller for controlling a direct current self-bias of the electrical discharge electrode. In case of feeding the electric power from the each RF electric source 26 via the each matching box 25, a discharge is caused between the substrate holders 9 and 9', the plasma of the high density or radical ions are generated in the neighborhood of the each plasma generating electrode 20, thereby etching the surface of the substrates 100.

Figure 4:
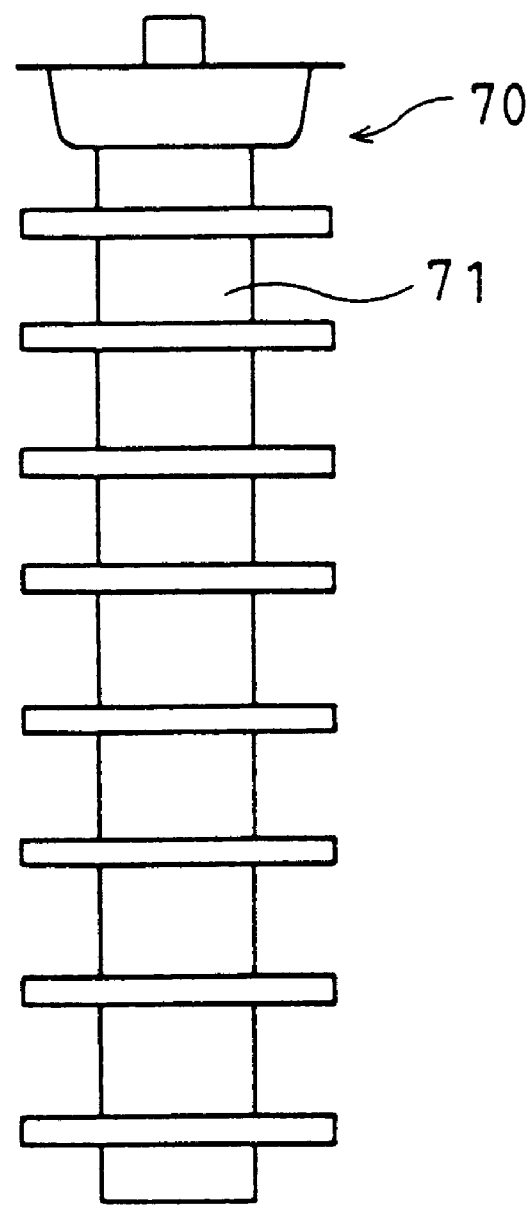
FIG. 4 is a longitudinal sectional view illustrating a structure of an anode electrode applied to the dry etching device according to the present invention.

In addition, as shown in FIG. 4, the anode electrode 70 has a structure wherein a metal shaft 71 composed of aluminium pierces a number of ring bodies 72.

Furthermore, in this embodiment, at the upper portion of the each plasma generating electrode 20, motors 27 are disposed as a driving unit, for reciprocating the plasma generating electrode 20 vertically with predetermined strokes. By the reciprocating movement, the density of the plasma generated in the neighborhood of the plasma generating electrode 20 is uniformed, thereby etching the surface of the each substrate 100 uniformly.

The each RF electrode power 26 has a structure wherein an RF voltage of some Hz to 100 MHz in frequency is applied to the plasma generating electrode 20 corresponding thereto in series or in a pulsing state (concretely, ON: 50 to 500 m sec, OFF: 5 to 100 m sec). In this case, when the self-bias voltage is high, sputtering from the plasma generating electrode 20 is caused, whereby it is desirable that the applied RF voltage is limited to a degree wherein the self-bias generated owing to the discharge is not raised, (that is less than −100 V). It is achieved by increasing a making electric power to make the plasma having as high an energy as possible generated. However, if the making electric power is increased, the self-bias voltage is raised with the result that there is a possibility of causing sputtering in the plasma generating electrode 20 and the abnormal discharge. Therefore, especially, in case of employing the RF electric power of the frequency (13.56 MHz) sputtered, it is preferable that a direct current component is grounded via a resistance of a few ohms by a low pass filter and adjusted so that the self-bias voltage may be a negative voltage of a few volts.

Structurally, the gas supply pipe 30 having one end connected to the gas supply source (not shown) pierces an upper wall body of the vacuum chamber 4, thereby disposing the gas supply pipe 30, having a pipe including a number of exhausting outlets, inside the vacuum chamber 4. Moreover, at the pipe between the gas supply source and the vacuum chamber 4, a microwave introducing device 31 is mounted. The microwave introducing device 31 constructed by a magnetron and a wave guide has a structure wherein a microwave (whose frequency is 2.45 GHz) is fed into proceeding gases such as $Cl_2$, $O_2$ and Ar fed from the gas supply source, thereby changing the gases into the plasma or activating the gases (that is, making the gases radical-conditioned). The gases changed into the plasma or activated are fed inside the vacuum chamber 4 via the gas supply pipe 30, to be exhausted from the exhausting outlets of the gas supply pipe 30 to the neighborhood of the plasma generating electrode 20 and the anode electrode 70.

By employing the dry etching device having the above structure according to the present embodiment, a method of etching a surface of the substrate of a liquid crystal substrate or the like is described as below.

As shown in FIG. 3, the substrates 100 are set in a predetermined condition on the both sides of the inner and outer substrate holders 9, 9' disposed concentrically on the rotating table 5 inside the vacuum chamber 4. Next, a door 42 of the entrance 41 of the vacuum chamber 4 is closed, thereby confining the vacuum chamber 4, before the inside of the vacuum chamber 4 is predeterminately vacuum-conditioned, and under the condition, the rotating table 5 is rotatively driven by the motor 7, thus rotating together the each substrate holder 9, 9' on the rotating table 5 and the each substrate 100 mounted thereon around the center axle 8.

Next, under such a condition, by the RF electric power, the DC electric power or the superposed both of them, a negative electric field is applied via the matching box 10 from the RF electric source 11 and the DC electric source 12 to the each substrate holder 9, 9', and the each plasma generating electrode 20 is reciprocated by the motors 27 with predetermined strokes in a vertical direction in FIG. 1 while the predetermined RF electric power is fed via the each matching box 25 from the RF electric source 26 corresponding to the each plasma generating electrode 20. At the same time, from an outside of the vacuum chamber 4 to the inside thereof, the processing gases such as $Cl_2$, $O_2$ and Ar is fed via the each supply pipe 30, when, in the middle of the gas supply pipe 30, the microwave is introduced from the microwave introducing device 31 to previously change a part of the processing gases previously into the plasma and ionize it (or make it radical-conditioned).

In this manner, the processing gases, wherein a part of the processing gases are previously changed into the plasma or ionized, are fed into the neighborhood of the each plasma generating electrode 20 and the each anode electrode 70, through the gas supply pipe 30. Owing to the discharge generated between the each plasma generating electrode 20 and the each substrate holder 9, 9', a further more amount of plasma is generated in the neighborhood of the each plasma generating electrode 20. A particle carrying a positive charge is acceleratively rushed to the each substrate holder 9, 9' by the negative electric field applied to the each substrate holder 9, 9' to crash into the each substrate 100, thereby etching physically the surface of the each substrate 100. In this time, the processing gases (such as chlorine radical Cl* or oxygen radical O*) in a radical state caused by changing the gases into the plasma or ionizing the gases are chemically reacted with molecules or atoms existing in the surface of the each substrate 100, thus urging the chemical etching. In this case, the permanent magnets 23 interfitted into the metal shaft 21 of the each plasma generating electrode 20 reciprocates inside a tube 201 with predetermined strokes in a vertical direction in FIG. 2, the plasma of the high density is uniformly fed into the each substrate 100 in a stable condition, and the number of the permanent magnets 23 is increased or decreased, thereby making the each plasma generating electrode 20 correspond to a size of the each substrate 100. As a result, it is possible to etch a large substrate at a time and in large numbers. Furthermore, the charge-up and the abnormal discharge in feeding the predetermined RF electric power into the each plasma generating electrode 20 can be prevented, whereby it can be achieved efficiently and uniformly to etch physically and chemically the each substrate 100. Consequently, even if a whole device is enlarged, it is not caused to decrease the density of the plasma in a conventional manner, and it is possible to etch the large substrate or the like in a great numbers and enhance the etching grade.

Figure 5:
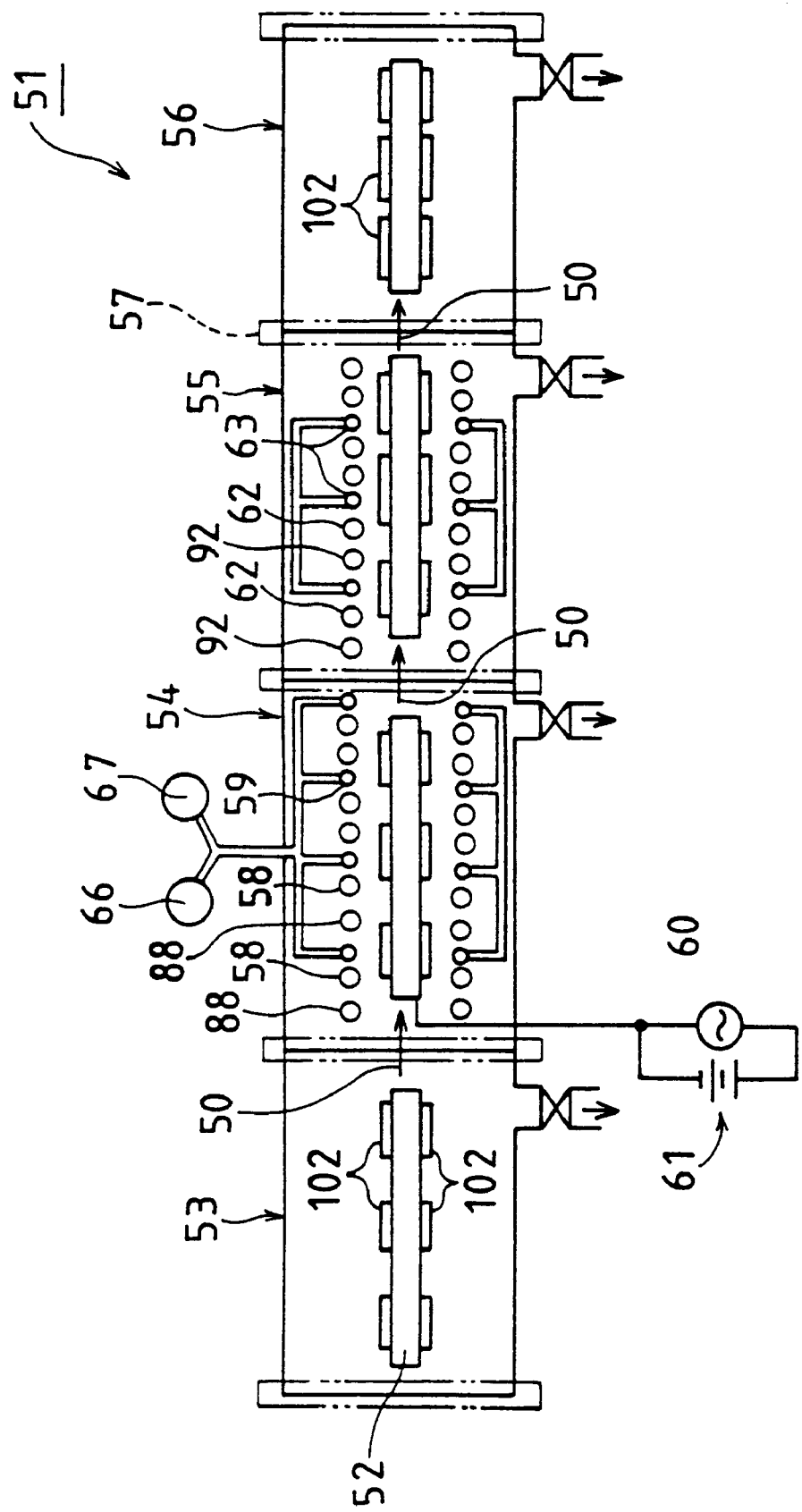
FIG. 5 is a plan view illustrating another embodiment of the dry etching device according to the present invention.

The each plasma generating electrode 20 is applicable to not only the dry etching device having a cylindrical vacuum chamber applied to the present embodiment, that is, a so-called Carnot cell-type dry etching device, but also a line-type one shown in FIG. 5, that is, a so-called in-line-type dry etching device. As another embodiment, an example employing the in-line-type dry etching device is described as below.

The in-line-type dry etching device 51 comprises a carrying-in chamber 53 for performing a setting operation for setting each substrate 102 on a substrate holder 52, an etching chamber 54 for etching a surface of the each substrate 102, an ash processing chamber 55 for laying it in ashes after etching it, and a carrying-out chamber 56 for performing a removing operation for removing the processed substrates 102 from the substrate holder 52, and all elements are arranged in line. A carrying conveyor (not shown) sequentially passes inside the each chamber 53 to 56 from the left to the right in FIG. 4, or in a direction shown by an arrow 50. Between the respective chambers from 53 to 56, freely opening and closing shutters (or valves) 57 for keeping the each chamber 53 to 56 confined and making them independently exhaust are disposed.

The etching chamber 54 includes, on either side (i.e., the upper side and the lower side in FIG. 4) of the substrate holder 52 along a carrying route thereof, a number of plasma generating electrodes 58 and anode electrodes 88, two kinds of gases that is a gas 66 and another gas 67, and gas supply pipes 59 for feeding the gas mixed with each other inside the etching chamber 54, wherein the gas supply pipes 59, the plasma generating electrodes 58 and the anode electrodes 88 are arranged in series at each predetermined interval. Outside the etching chamber 54, an RF electric source 60 and a DC electric source 61 are arranged, and a predetermined RF electric power, a predetermined DC electric power, or the predetermined both electric powers which are superposed, is applied from the electric sources to the substrate holder 52 inside the etching chamber 54. In this case, the plasma generating electrode 58 and the anode electrode 88, the gas supply pipe 59, the RF electric source 60 and the DC electric source 61 basically have the same structure as the dry etching device 1 shown in FIG. 2 has.

In the dry etching device 51, the ash processing chamber 55 also includes a number of plasma generating devices 62 and anode electrodes 92, and gas supply pipes 63. Inside the ash processing chamber 55, an $O_2$ gas is fed, and the $O_2$ gas is changed into an $O_2$ plasma by the plasma generating devices 62 and the anode electrodes 92, and an ash processing for laying a rest of a resist development or the like in ashes is performed by the $O_2$ plasma.

The in-line-type dry etching device 51 enables a series of steps from etching to laying the surface of the substrate in ashes to be achieved. That is, setting the substrates 102 on the substrate holder 52 at the carrying-in chamber 53, carrying the substrates 102 to the etching chamber 54 by means of the carrying conveyor, etching the substrates 102 while passing between the plasma generating electrodes 58 and the anode electrodes 88 disposed on the both sides of the substrate holder 52, carrying the substrates 102 to the ash processing chamber 55, and taking the ash processing to them.

What is claimed is:

1. A dry etching device comprising:
    a vacuum chamber connected to a vacuum source,
    a gas supply unit including a gas supply source and a number of gas supply pipes for leading a gas from the gas supply source to an inside of the vacuum chamber, and
    a number of electrical discharge electrodes, respectively arranged inside the vacuum chamber, for changing the gas led to the inside of the vacuum chamber into a plasma, active ions or both of the plasma and the active ions,
    wherein the electrical discharge electrode has a number of circular or polygonal ring shaped permanent magnets detachably interfitted into a shaft at regular intervals via each insulator in a magnetizing direction of the each permanent magnet, and aligned so that each magnet pole of the permanent magnets adjacent to each other may be equal to that of the adjacent permanent magnet.

2. A dry etching device according to claim 1, wherein the electrical discharge electrode is provided with driving means for reciprocating the permanent magnets in an aligning direction thereof with predetermined strokes.

3. A dry etching device according to claim 1, wherein the gas supply unit is provided with microwave introducing means for introducing a microwave for previously changing the gas fed inside the vacuum chamber into the plasma, the active ions or the both of the plasma and the active ions.

4. A dry etching device according to claim 2, wherein the gas supply unit is provided with microwave introducing means for introducing a microwave for previously changing the gas fed inside the vacuum chamber into the plasma, the active ions or the both of the plasma and the active ions.

5. A dry etching device according to claim 1, wherein an anode electrode is disposed in the neighborhood of the each electrical discharge electrode.

6. A dry etching device according to claim 2, wherein an anode electrode is disposed in the neighborhood of the each electrical discharge electrode.

7. A dry etching device according to claim 3, wherein an anode electrode is disposed in the neighborhood of the each electrical discharge electrode.

8. A dry etching device according to claim 4, wherein an anode electrode is disposed in the neighborhood of the each electrical discharge electrode.

9. A dry etching device according to claim 1, wherein the dry etching device is provided with each matching box incorporating a phase shifter for controlling a phase of a high frequency electric power fed to the each electrical discharging electrode, and a bias controller for controlling a direct current self-bias of the each electrical discharge electrode, thereby feeding the electric power from the high frequency electric power to the each electric discharge electrode via the each matching box.

10. A dry etching device according to claim 2, wherein the dry etching device is provided with each matching box incorporating a phase shifter for controlling a phase of a high frequency electric power fed to the each electrical discharging electrode, and a bias controller for controlling a direct current self-bias of the each electrical discharge electrode, thereby feeding the electric power from the high frequency electric power to the each electric discharge electrode via the each matching box.

11. A dry etching device according to claim 3, wherein the dry etching device is provided with each matching box incorporating a phase shifter for controlling a phase of a high frequency electric power fed to the each electrical discharging electrode, and a bias controller for controlling a direct current self-bias of the each electrical discharge electrode, thereby feeding the electric power from the high frequency electric power to the each electric discharge electrode via the each matching box.

12. A dry etching device according to claim 4, wherein the dry etching device is provided with each matching box incorporating a phase shifter for controlling a phase of a high frequency electric power fed to the each electrical discharging electrode, and a bias controller for controlling a direct current self-bias of the each electrical discharge electrode, thereby feeding the electric power from the high frequency electric power to the each electric discharge electrode via the each matching box.

13. A dry etching device according to claim 5, wherein the dry etching device is provided with each matching box incorporating a phase shifter for controlling a phase of a high frequency electric power fed to the each electrical discharging electrode, and a bias controller for controlling a direct current self-bias of the each electrical discharge electrode, thereby feeding the electric power from the high frequency electric power to the each electric discharge electrode via the each matching box.

14. A dry etching device according to claim 6, wherein the dry etching device is provided with each matching box incorporating a phase shifter for controlling a phase of a high frequency electric power fed to the each electrical discharging electrode, and a bias controller for controlling a direct current self-bias of the each electrical discharge electrode, thereby feeding the electric power from the high frequency electric power to the each electric discharge electrode via the each matching box.

15. A dry etching device according to claim 7, wherein the dry etching device is provided with each matching box incorporating a phase shifter for controlling a phase of a high frequency electric power fed to the each electrical discharging electrode, and a bias controller for controlling a direct current self-bias of the each electrical discharge electrode, thereby feeding the electric power from the high frequency electric power to the each electric discharge electrode via the each matching box.

16. A dry etching device according to claim 8, wherein the dry etching device is provided with each matching box incorporating a phase shifter for controlling a phase of a high frequency electric power fed to the each electrical discharging electrode, and a bias controller for controlling a direct current self-bias of the each electrical discharge electrode, thereby feeding the electric power from the high frequency electric power to the each electric discharge electrode via the each matching box.

17. A dry etching device according to claim 8, wherein a rotating table and a number of substrate holders, concentrically disposed on a circumference of the rotating table, for supporting a number of substrates etched on the respective upper surfaces and lower surfaces thereof are disposed inside the vacuum chamber, and the electrical discharge electrodes and the gas supply pipes are concentrically positioned opposite to each other along a moving locus of the each substrate on the respective upper surface and lower surface of the each substrate holders.

18. A dry etching device according to claim 16, wherein a rotating table and a number of substrate holders, concentrically disposed on a circumference of the rotating table, for supporting a number of substrates etched on the respective upper surfaces and lower surfaces thereof are disposed inside the vacuum chamber, and the electrical discharge electrodes and the gas supply pipes are concentrically positioned opposite to each other along a moving locus of the each substrate on the respective upper surface and lower surface of the each substrate holders.

19. A dry etching device according to claim 8, wherein a carrier conveyor for linearly moving and a number of substrate holders, disposed on the carrier conveyor, for supporting a number of substrates etched on the respective upper surfaces and lower surfaces thereof are disposed inside the vacuum chamber, and the electrical discharge electrodes and the gas supply pipes are linearly positioned opposite to each other along a moving locus of the each substrate on the respective upper surface and lower surface of the each substrate holder.

20. A dry etching device according to claim 16, wherein a carrier conveyor for linearly moving and a number of substrate holders, disposed on the carrier conveyor, for supporting a number of substrates etched on the respective upper surfaces and lower surfaces thereof are disposed inside the vacuum chamber, and the electrical discharge electrodes and the gas supply pipes are linearly positioned opposite to each other along a moving locus of the each substrate on the respective upper surface and lower surface of the each substrate holder.

* * * * *